(12) United States Patent
Lee et al.

(10) Patent No.: US 7,465,993 B2
(45) Date of Patent: Dec. 16, 2008

(54) SEMICONDUCTOR CHIPS HAVING IMPROVED ELECTROSTATIC DISCHARGE PROTECTION CIRCUIT ARRANGEMENT

(75) Inventors: Ki-Tae Lee, Seongnam-si (KR);
Han-Gu Kim, Seongnam-si (KR);
Jae-Hyok Ko, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 141 days.

(21) Appl. No.: 11/654,638

(22) Filed: Jan. 18, 2007

(65) Prior Publication Data
US 2007/0176241 A1    Aug. 2, 2007

(30) Foreign Application Priority Data
Jan. 31, 2006    (KR) ................. 10-2006-0009389

(51) Int. Cl.
*H01L 23/62* (2006.01)
(52) U.S. Cl. .................. 257/355; 257/356; 257/737
(58) Field of Classification Search ................. 257/355, 257/356, 737
See application file for complete search history.

(56) References Cited

U.S. PATENT DOCUMENTS
2002/0109189 A1    8/2002    Chen et al.

FOREIGN PATENT DOCUMENTS
JP    11-261011    9/1999
KR    10-2000-0059381    10/2000

*Primary Examiner*—Douglas M Menz
(74) *Attorney, Agent, or Firm*—Harness, Dickey & Pierce, P.L.C.

(57) ABSTRACT

A semiconductor chip may include a plurality of pads arranged in at least a first and a second row, and a plurality of protection circuits connected to the plurality of pads. The plurality of protection circuits may include at least one diode. A first protection circuit may be connected to a first pad in the first row of pads, and a second protection circuit may be connected to a second pad in the second row of pads. The first and second protection circuits may be arranged under the first row of pads.

20 Claims, 4 Drawing Sheets

SEMICONDUCTOR CHIPS HAVING IMPROVED ELECTROSTATIC DISCHARGE PROTECTION CIRCUIT ARRANGEMENT

PRIORITY STATEMENT

This application claims priority under 35 U.S.C. § 119 to Korean Patent Application No. 10-2006-0009389, filed on Jan. 31, 2006, in the Korean Intellectual Property Office (KIPO), the entire contents of which are incorporated herein by reference.

BACKGROUND

Description of the Conventional Art

Electrostatic discharge (ESD) occurs when the static electricity caused by electric field induction and/or friction between objects is discharged through a semiconductor chip. As conventional semiconductor chips become increasingly integrated, static electricity may be introduced into wires through pads and may damage the semiconductor chips. To protect circuits inside or on semiconductor chips from ESD, conventional semiconductor chips may include an ESD protection circuit.

An ESD protection circuit may be arranged near the pads of the semiconductor chip, and/or between the pad and the main circuit of the chip. When static electricity is introduced through the pads, the ESD protection circuit protects circuits inside or on (e.g., the main circuit) of the semiconductor chip against the static electricity by discharging the static electricity through a designated path.

FIG. 1 is a schematic view showing a conventional arrangement of pads on a conventional semiconductor chip. As shown, a plurality of pads may be formed in a staggered structure on one side of a semiconductor chip 1. Data and/or control signals may be transmitted and received to and from the external circuit. As conventional semiconductor chips become increasingly integrated, the number of channels arranged on the semiconductor chip may increase. However, as the size of the semiconductor chip is reduced, the size of each pad arranged on the chip and/or the area on which the pads are placed may decrease.

Referring still to FIG. 1, the plurality of pads may be arranged on the semiconductor chip 1 in one or more rows. The plurality of pads shown in FIG. 1 may be arranged in a first row 2a on an outer side of the semiconductor chip and a second row 2b on an inner side of the semiconductor chip. The first row of pads 2a and the second row of pads 2b may be arranged in a zigzag or staggered arrangement, such that each pad in the second row of pads 2b falls between two pads in the first row of pads 2a.

FIG. 2 is a circuit diagram showing an example operation of a conventional ESD protection circuit. As shown, the conventional ESD protection circuit may include an internal circuit 3 for transmitting and receiving signals to and from an external circuit through the pad. The internal circuit 3 may be connected to the pad through a resistor R.

The ESD protection circuit of FIG. 2 may include one or more diodes. For example, the ESD protection circuit may include a first diode D1 and a second diode D2. The first diode D1 and the second diode D2 may be connected between the pad and a power clamp 4, and may transmit currents i1 and i2. The currents i1 and i2 may be induced by static electricity introduced through the pad to the power clamp 4.

Conventionally, the extent to which the size of a semiconductor chip may be reduced may be limited by the ESD protection circuit. For example, the size of the semiconductor chip may be determined based on the size of the ESD protection circuit.

FIG. 3 is a block diagram showing a conventional ESD protection circuit having a pad on I/O (POI) structure. FIG. 3 shows two outer pads 21 and 22 from first row 2a of FIG. 1, and an inner pad 23 from second row 2b of FIG. 1. Each of the pads 21, 22 and 23 may be connected to an ESD protection circuit for protecting an internal circuit of the semiconductor chip. For example, outer pads 21 and 22 may be connected to ESD protection circuits 31 and 32, respectively, and inner pad 23 may be connected to an ESD protection circuit 33. Each of the ESD protection circuits 31, 32 and 33 may include an N-type diode and a P-type diode.

An N-type diode 31a and a P-type diode 31b may be arranged under and connected to the outer pad 21. An N-type diode 32a and a P-type diode 32b may be arranged under and connected to the outer pad 22. An N-type diode 33a and a P-type diode 33b may be arranged under and connected to the inner pad 23.

A conventional semiconductor chip having the structure of FIG. 3 may have more stable ESD characteristics; however, ESD protection circuits arranged under outer pads and inner pads may increase the vertical size of the chip.

For example, each pad may have a horizontal width and the vertical length. As the number of the pads increases, the width of the pad may decrease. However, even if the ESD arranged under the inner pad is moved to the outer empty area of the chip, the size of ESD protection circuits required for higher voltage processes may increase, which may limit the maximum number of the pads.

SUMMARY

Example embodiments of the present invention relate to semiconductor chips, for example, semiconductor chips having improved arrangement of electrostatic discharge (ESD) protection circuits.

Example embodiments of the present invention provide semiconductor chips with an improved a layout of an electrostatic discharge (ESD) protection circuit and/or which may be capable of increasing the number of pads without deterioration of a protection function against ESD. Example embodiments of the present invention may also have reduced chip size According to at least one example embodiment, a semiconductor chip may include pads and a plurality of ESD protection circuits. The pads may include one or more rows of the pads arranged in a staggered or zigzag structure, the plurality of ESD protection circuits may be connected to the pads. The ESD protection circuits may protect the internal circuit of the chip against ESD and may include one or more diodes. A first ESD protection circuit connected to the first pad and a second ESD protection circuit connected to a second pad, which may be formed on an inner side of the semiconductor chip and may neighbor the first pad, may be arranged under the first pad formed on an outer side of the semiconductor chip.

In at least some example embodiments, the semiconductor chip may further include a conducting layer connected to the second pad. The conducting layer may be located between the two pads formed on the outer side of the semiconductor chip and may neighbor the second pad. The second ESD protection circuit may be connected to the conducting layer. The first ESD protection circuit may include an N-type diode and a P-type diode each of which may be connected to the first pad. The second ESD protection circuit may include an N-type diode and a P-type diode, each of which may be connected to the second pad.

According to at least one other example embodiment, a semiconductor chip may include pads and a plurality of ESD protection circuits. The pads may include one or more rows of the pads arranged in a staggered or zigzag structure. A plurality of ESD protection circuits may be connected to the pads, and may protect the internal circuit of the chip against ESD. At least one of the ESD protection circuits may include one or more diodes. The semiconductor chip may include n numbers of ESD protection circuits (where n is an integer equal to or greater than 2) connected the pads. The ESD protection circuits may be arranged under the first pad formed on an outer side of the semiconductor chip.

The first ESD protection circuit among the plurality of ESD protection circuits may be connected to the first pad, and the remaining (e.g., a second to an nth) ESD protection circuits may be connected to a second to an nth of the pads formed on an inner side of the semiconductor chip.

According to at least one other example embodiment, a semiconductor chip may include pads. The pads may include at least one row of pads arranged in a staggered or zigzag structure and may have a shape with a longer side and a shorter side. A first ESD protection circuit may be connected to a first pad formed on an outer side of the semiconductor chip. The first ESD protection circuit may include one or more diodes each having a shape with a longer side and a shorter side. A second ESD protection circuit may be connected to a second pad that neighbors the first pad. The first pad may be formed on an inner side of the semiconductor chip, and the second ESD protection circuit may include one or more diodes each having a shape with a longer side and a shorter side. The first ESD protection circuit and the second ESD protection circuit may be arranged under the first pad, and the longer side of the diodes included in the first and second ESD protection circuit may be arranged orthogonal to the longer side of the first pad.

BRIEF DESCRIPTION OF THE DRAWINGS

Example embodiments will be described with reference to the attached drawings in which.

DETAILED DESCRIPTION OF EXAMPLE EMBODIMENTS

Figure 1:
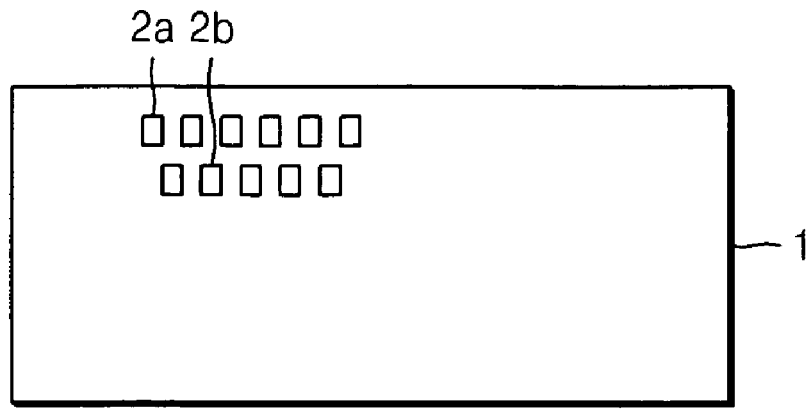
FIG. 1 is a schematic view showing a plurality of pads arranged on a conventional semiconductor chip.
Figure 2:
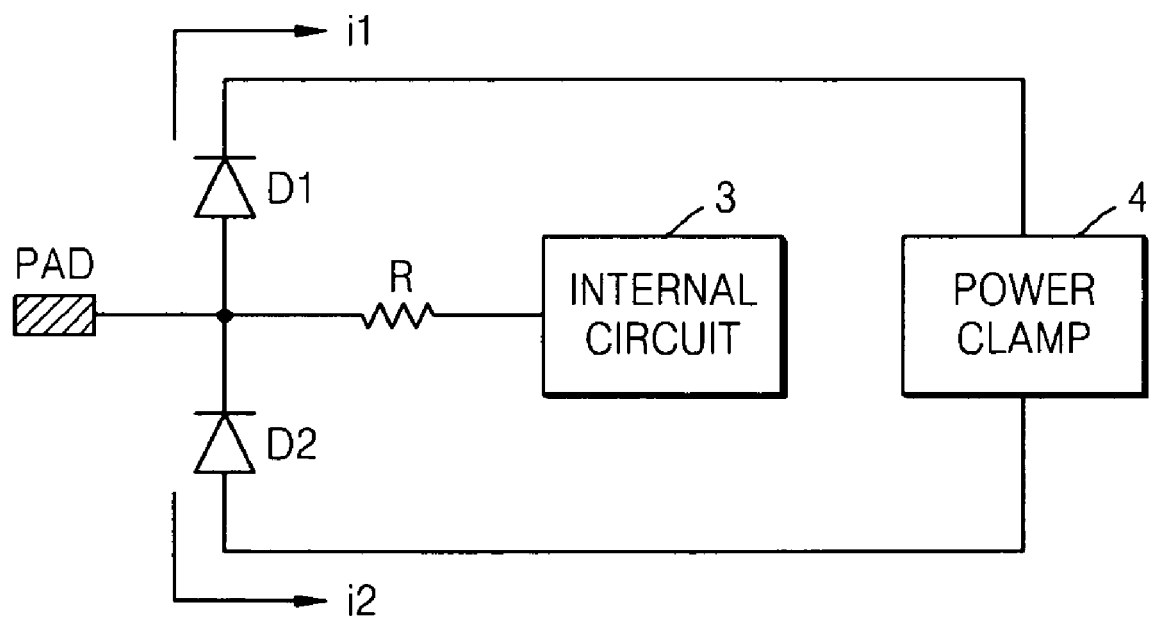
FIG. 2 is a circuit diagram showing an example operation of a conventional electrostatic discharge (ESD) protection circuit.
Figure 3:
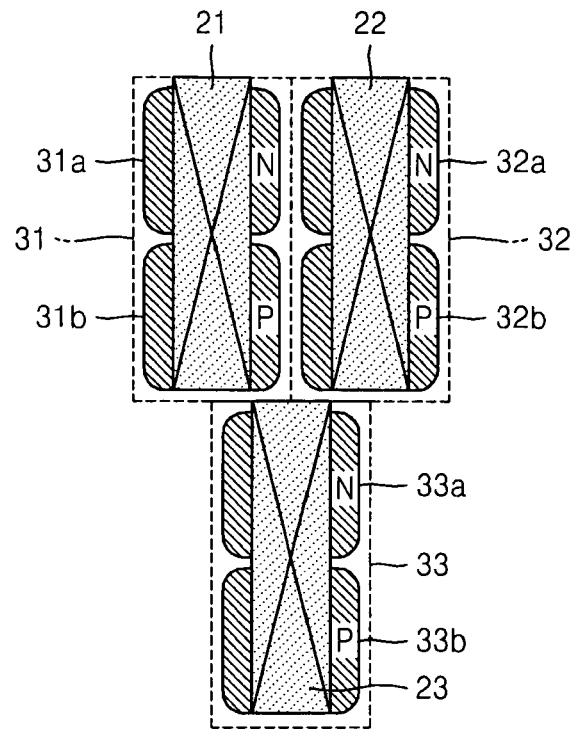
FIG. 3 is a block diagram showing a conventional ESD protection circuit having a pad on I/O (POI) structure.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 4:
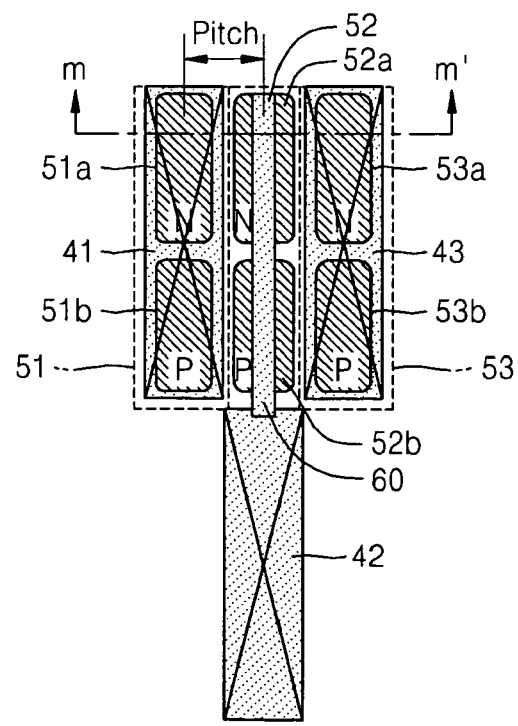
FIG. 4 is a block diagram showing an ESD protection circuit, according to an example embodiment of the present invention.

FIG. 4 is a block diagram showing an ESD protection circuit, according to an example embodiment of the present invention. Outer pads 41 and 43 are two example pads from row 2a of FIG. 1, and inner pad 42 is an example pad from row 2b of FIG. 1.

Each of the pads 41, 42, and 43 may be connected to a respective ESD protection circuit. Each ESD protection circuit may include an N-type diode and a P-type diode. For example, ESD protection circuit 51 may include an N-type diode 51*a* and a P-type diode 51*b*, each of which may be electrically connected to the outer pad 41. ESD protection circuit 53 may include an N-type diode 53*a* and a P-type diode 53*b*, each of which may be electrically connected to the outer pad 43. ESD protection circuit 52 may include an N-type diode 52*a* and a P-type diode 52*b* each of which may be connected to the inner pad 42.

ESD protection circuit 51 may be located under the outer pad 41, ESD protection circuit 53 may be arranged under the outer pad 43.

In at least some example embodiments of the present invention, pads may be arranged on a semiconductor chip, for example, in a staggered shape such that ESD protection circuit 52 may be located between the outer pads 41 and 43, while being connected to the lower pad 42. A conductive layer 60 located between the two outer pads 41 and 43 may electrically connect the N-type diode 52*a* and the P-type diode 52*b* of the ESD protection circuit 52 to the lower pad 42.

When the ESD protection circuit, according to at least one example embodiment of the present invention, is arranged as shown in FIG. 4, ESD protection circuits connected to inner pads in the staggered structure may be located under the outer pads. In this example, the internal circuit of the semiconductor chip (e.g., a memory core, a driver, etc.) may be located under the inner pads, and chip size may be reduced.

However, according to the example embodiment of FIG. 4, the width of a diode including a guard-ring (not shown) in the ESD protection circuit may require a length corresponding to the pad pitch. Diode design requirements may limit the amount by which the size of the pad pitch may be reduced.

Figure 5:
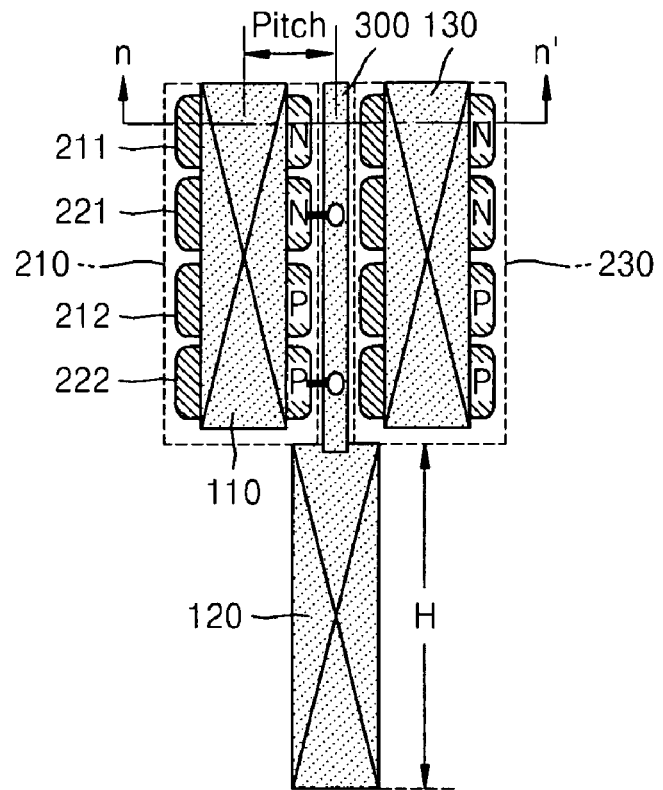
FIG. 5 is a block diagram showing an ESD protection circuit according to an example embodiment of the present invention.

FIG. 5 is a block diagram showing another layout of an ESD protection circuit, according to another example embodiment of the present invention. Outer pads 110 and 130 are two example pads from row 2*a* of FIG. 1 and inner pad 120 is an example pad from row 2*b* of FIG. 1.

Each of pads 110, 120, and 130 may be electrically connected to an ESD protection circuit for protecting the internal circuit of the chip, and each ESD protection circuit may include one or more diodes. For example, each ESD protection circuit may include an N-type diode and a P-type diode.

As shown in FIG. 5, a plurality of ESD protection circuits 210 may be arranged under outer pad 110. For example, the plurality of ESD protection circuits 210 arranged under outer pad 110 may include at least a first ESD protection circuit and a second ESD protection circuit, which may be electrically connected to outer pads 110 and 120, respectively. The first ESD protection circuit may include an N-type diode 211 and a P-type diode 212, which may be connected to the outer pad 110, and the second ESD protection circuit may include an N-type diode 221 and a P-type diode 222, which may be electrically connected to the inner pad 120.

The semiconductor chip may further include a conductive layer 300, which may be located between the outer pads 110 and 130, and may electrically connect N-type diode 221 and P-type diode 222 of the second ESD protection circuit to inner pad 120.

A plurality of ESD protection circuits 230 arranged under outer pad 130 may include an ESD protection circuit (e.g., including an N-type diode and a P-type diode) connected to outer pad 130 and an ESD protection circuit connected to another inner pad (not shown) neighboring and/or adjacent to the third pad 130. This structure of the ESD protection circuit may be used in conjunction with, for example, a staggered structure such as shown in FIG. 1.

As described above, the internal circuit of the semiconductor chip may be located under the inner pads, and semiconductor chip size (e.g., the length of a short side of the chip, such as in the direction of the height of the pad, H) may be reduced. In the example embodiment shown in FIG. 5, the width of the diode (e.g., including a guard-ring) may be a length corresponding to the two pad pitches (2*pitch).

Figure 6:
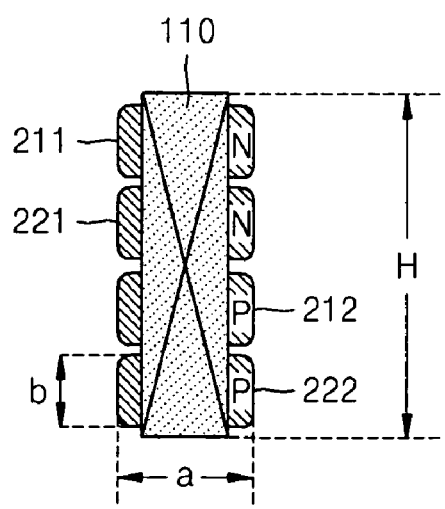
FIG. 6 is a block diagram showing a longer side and a shorter side of an ESD protection circuit, according to an example embodiment of the present invention.

FIG. 6 is a block diagram showing a longer side and a shorter side of the ESD protection circuit, according to an example embodiment of the present invention. As shown, a pad on the semiconductor chip may have a longer side and a shorter side. The longer side may be the height of the pad H, and the shorter side may be the width of the pad.

A plurality of the ESD protection circuits may be arranged under a pad 110. The first ESD protection circuit including N-type diode 211 and P-type diode 212 may be connected to pad 110, and the second ESD protection circuit including N-type diode 221 and P-type diode 222 may be connected to pad 120.

The N-type diodes 211 and 221 and the P-type diodes 212 and 222 may be embodied by semiconductor layers, may have a longer side "a" and may have a shorter side "b", respectively. When arranging the N-type diodes 211 and 221 and the P-type diodes 212 and 222 under pad 110, the longer side of the diode "a" may be orthogonal or substantially orthogonal to the longer side of the first pad 110. As described with respect to FIG. 5, one diode may be arranged every two pitches, which may ensure sufficient area for arranging the diode. Accordingly, the longer side of the diode may be arranged in the pitch direction of pad 110.

Figure 7A:
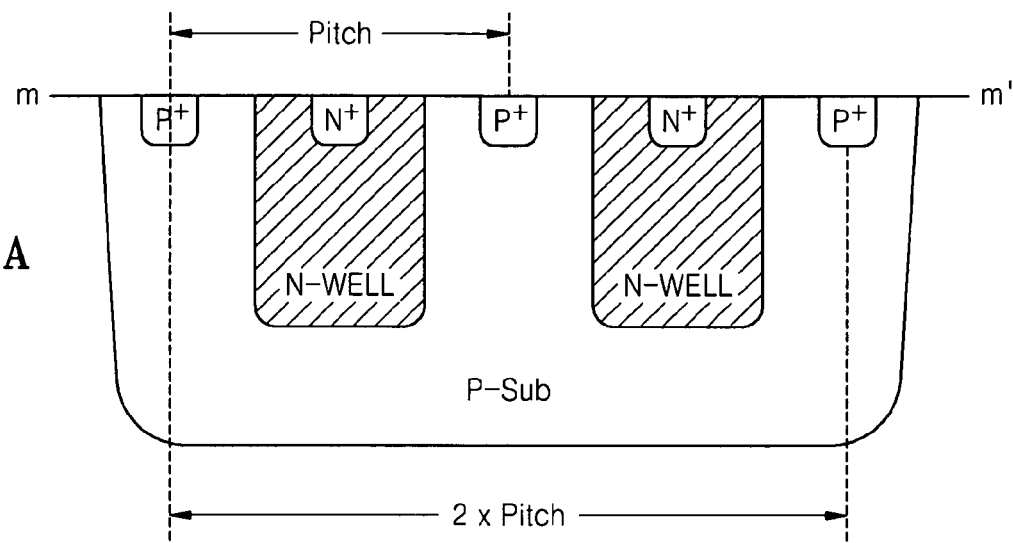
FIGS. 7A and 7B show sectional views taken along directions of the pitches of the pads of FIGS. 4 and 5.
Figure 7B:
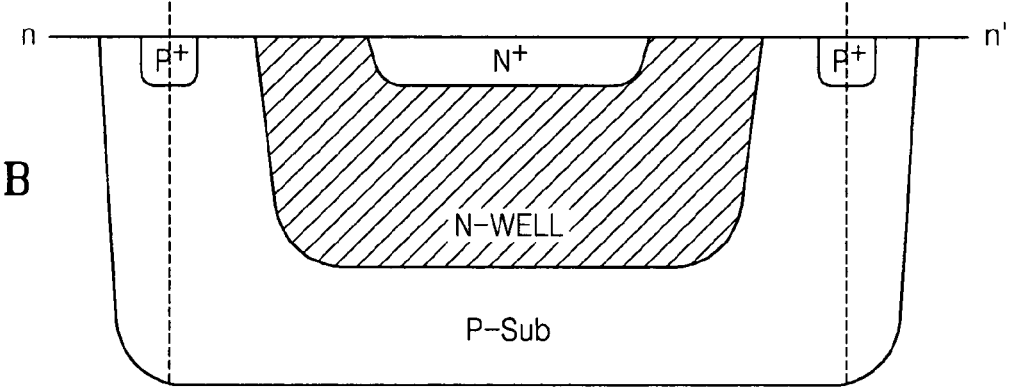

FIGS. 7A and 7B are sectional views along directions of the pitches of pads in FIGS. 4 and 5. FIG. 7A is a sectional view taken along the line m-m' in FIG. 4. As shown, the N-type diode 51*a* may be connected to outer pad 41 and the N-type diode 52*a* may be connected to inner pad 42. While not shown in FIG. 7A, an N+ semiconductor layer may be connected to a pad (not shown), and a P+ semiconductor layer may be connected to ground, and a current (e.g., negative current) induced by the static electricity introduced through the pad may be discharged.

As described above, in an example embodiment of the semiconductor chip shown in FIG. 4, one diode may be formed every pad pitch. A P+, an N+ and an N-WELL for forming one diode every pitch may be formed on a substrate P-sub. The distance between the P+ and the N-WELL may be constant or substantially constant based on threshold voltage characteristics of the diode, and when the pad pitch decreases, the lengths of the N+ layer and the N-WELL layer may decrease. However, in FIG. 7A, the amount by which the lengths of the N+ layer and the N-WELL layer may be reduced may be limited. FIG. 7B is a sectional view taken along the line n-n' in FIG. 5. As shown, a diode arranged may be arranged every two pad pitches.

In the example embodiment of the semiconductor chip shown in FIG. 5, one diode may be formed every two pad pitches. A P+, an N+, and an N-WELL for forming one diode every pitch as shown in FIG. 7B may be formed on a substrate P-sub. One diode may be arranged every two pad pitches, and the longer sides of the N+, and the N-WELL may be formed in the pad pitch direction. Accordingly, the length of the N+ and the N-WELL in the diode may be reduced as the pad pitch is reduced. This may improve diode characteristics by reducing the pad pitch.

As described above, according to at least some example embodiments of the present invention, chip size may be reduced by improving the layout of the ESD protection circuit(s) on or in semiconductor chips. In addition, size limitations due to the ESD protection circuit may be suppressed and/or minimized when the number of the pads formed on the semiconductor chips is reduced.

While example embodiments of the present invention have been shown and described, it will be understood by those of ordinary skill in the art that various changes in form and details may be made therein without departing from the spirit and scope of the present invention as defined by the following claims.

What is claimed is:

1. A semiconductor device comprising:
   a plurality of pads arranged in at least a first row and a second row, the plurality of pads including at least a first pad formed in the first row on an outer portion of a semiconductor chip and at least a second pad formed in the second row on an inner portion of a semiconductor chip; and
   a plurality of protection circuits connected to the plurality of pads, the plurality of protection circuits including at least a first protection circuit connected to the first pad and a second protection circuit connected to a second pad, the first and second protection circuits being arranged under the first row of pads.

2. The semiconductor device of claim 1, further including,
   a conductive layer connected to the second pad and located between the first pad and at least one other pad in the first row.

3. The semiconductor device of claim 2, wherein the second protection circuit is connected to the conductive layer.

4. The semiconductor device of claim 1, wherein the first protection circuit further includes,
   at least a first diode and a second diode, each of the first and second diodes having a different conductivity-type and being connected to the first pad.

5. The semiconductor device of claim 4, wherein the first diode is an N-type diode and the second diode is a P-type diode.

6. The semiconductor device of claim 1, wherein the second protection circuit further includes,
   at least a first diode and a second diode, each of the first and second diodes having a different conductivity-type, and being connected to the second pad.

7. The semiconductor device of claim 6, wherein the first diode is an N-type diode and the second diode is a P-type diode.

8. The semiconductor device of claim 1, wherein each of the plurality of protection circuits includes at least one diode, and at least two of the plurality of protection circuits are arranged under at least the first pad.

9. The semiconductor device of claim 8, wherein each of the plurality of protection circuits is connected a corresponding one of the plurality of pads.

10. The semiconductor chip of claim 1, wherein the first protection circuit and the second protection circuit are arranged under the first row of pads, the first protection circuit being connected to and formed under the first pad, and the second protection circuit being connected to the second pad and formed on a portion of the semiconductor chip adjacent to a portion of the semiconductor chip on which the first pad is formed.

11. The semiconductor chip of claim 8, further including,
    a conductive layer connected to the second pad and located between two pads in the first row of pads.

12. The semiconductor chip of claim 11, wherein one of the plurality of protection circuits is connected to the conductive layer.

13. The semiconductor of claim 8, wherein each of the plurality of protection circuits includes a first diode and a second diode.

14. The semiconductor device of claim 13, wherein the first diode is an N-type diode and the second diode is a P-type diode.

15. The semiconductor device of claim 1, wherein at least one of the plurality of pads has a rectangular shape, and at least the first and the second protection circuits includes at least one diode, each of the at least one diode having a rectangular shape, and a side the at least one diode in the first and second protection circuits are orthogonal to a side of the first pad.

16. The semiconductor device of claim 15, further including,
    a conductive layer connected to the second pad and located between two pads in the first row of pads.

17. The semiconductor device of claim 15, wherein the second protection circuit is connected to the conductive layer.

18. The semiconductor device of claim 15, wherein at least the first protection circuit further includes a first diode and a second diode connected to the first pad.

19. The semiconductor device of claim 18, wherein the first diode is an N-type diode and the second diode is a P-type diode.

20. The semiconductor device of claim 15, wherein the second protection circuit further includes a first diode and a second diode connected to the second pad, the first diode being an N-type diode and the second diode being a P-type diode.

* * * * *